(12) United States Patent
Kitajima

(10) Patent No.: US 9,220,164 B2
(45) Date of Patent: Dec. 22, 2015

(54) HIGH FREQUENCY MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/489,555

(22) Filed: Sep. 18, 2014

(65) Prior Publication Data

US 2015/0216033 A1 Jul. 30, 2015

(30) Foreign Application Priority Data

Jan. 28, 2014 (JP) ................. 2014-013005

(51) Int. Cl.
*H04M 1/00* (2006.01)
*H05K 1/02* (2006.01)
*H05K 1/18* (2006.01)
*H01P 3/16* (2006.01)
*H04M 1/02* (2006.01)

(52) U.S. Cl.
CPC ............... *H05K 1/0216* (2013.01); *H01P 3/16* (2013.01); *H04M 1/026* (2013.01); *H05K 1/024* (2013.01); *H05K 1/0242* (2013.01); *H05K 1/0243* (2013.01); *H05K 1/181* (2013.01)

(58) Field of Classification Search
CPC ... H05K 1/0216; H05K 1/024; H05K 1/0242; H05K 1/0243; H05K 1/181; H01P 3/16; H04M 1/026
USPC ........ 455/550.1; 174/255, 262, 264; 257/206, 257/296, 369, 713, 738; 333/132, 185; 365/104; 361/111, 303, 328, 746, 762
See application file for complete search history.

(56) References Cited

U.S. PATENT DOCUMENTS

2006/0081977 A1* 4/2006 Sakai et al. .................... 257/703
2006/0186755 A1* 8/2006 Mori et al. ................ 310/313 R
2008/0238585 A1* 10/2008 Tokoro ........................... 333/247

FOREIGN PATENT DOCUMENTS

JP 2008-244179 A 10/2008

* cited by examiner

*Primary Examiner* — Dhaval Patel
(74) *Attorney, Agent, or Firm* — Keating & Bennett, LLP

(57) ABSTRACT

A high frequency module includes a ground mounting electrode connected to a ground terminal of a component, a first ground in-plane conductor in a multilayer substrate on a portion under the component and connected to the ground mounting electrode with a first ground interlayer connecting conductor, a signal mounting electrode connected to a signal terminal of the component, and a signal in-plane conductor provided in the multilayer substrate on a portion under the first ground in-plane conductor and connected to the specific signal mounting electrode with a signal interlayer connecting conductor. The first ground in-plane conductor is between the component and the signal in-plane conductor, and the signal interlayer connecting conductor is on an outer side portion of the first ground in-plane conductor when seen from above.

14 Claims, 4 Drawing Sheets

HIGH FREQUENCY MODULE

BACKGROUND OF THE INVENTION

1. Field of the Invention

The present invention relates to a high frequency module on which a component is mounted on an upper surface of a multilayer substrate. More specifically, the present invention relates to a technique of manufacturing a high frequency module at reduced cost while preventing electromagnetic coupling between an in-plane conductor that is provided in the multilayer substrate and the component and reducing the size of the high frequency module.

2. Description of the Related Art

With size reduction of a communication terminal device such as a cellular phone, a high frequency module that is arranged therein is required to be reduced in size. In order to achieve this, a multilayer substrate capable of establishing three-dimensional wiring has been widely used for a circuit substrate of the high frequency module. For example, a high frequency module 100 as described in Japanese Patent Application Laid-open No. 2008-244179 (see, for example, paragraph 0022, FIG. 1, and the like) includes a multilayer substrate 101 and a semiconductor element 102 as illustrated in FIG. 7. The multilayer substrate 101 is formed by laminating a plurality of insulating layers. The semiconductor element 102 is mounted on the upper surface of the multilayer substrate 101. Further, a ground electrode 103 for grounding is provided in the multilayer substrate 101 on a portion under the semiconductor element 102.

An area of the main surface of the multilayer substrate 101 is restricted in order to reduce the high frequency module 100 in size. Under this condition, when wiring paths that are connected to respective terminals of the semiconductor element 102 are tried to be formed in the multilayer substrate 101, there is no choice but to form some wiring paths that are connected to predetermined signal terminals so as to pass through portions under the ground electrode 103 in some cases. For coping with this, in the high frequency module 100, openings are provided on portions of the ground electrode 103 at positions just under the predetermined signal terminals of the semiconductor element 102 and through-holes 104 passing through the openings are provided on the multilayer substrate 101. Further, the predetermined signal terminals are connected to wiring electrodes 105 and 106 formed at the lower side of the ground electrode 103 through the through-holes 104. With this, the wiring paths that are connected to the predetermined signal terminals are led out to outer side portions of the semiconductor element 102 through the portions under the ground electrode 103.

The existing high frequency module 100 has the configuration in which some wiring paths that are connected to the predetermined signal terminals of the semiconductor element 102 are provided on the portions under the ground electrode 103 by providing the openings on the ground electrode 103 and forming the through-holes 104 passing through the openings. The configuration, however, increases the manufacturing cost of the high frequency module 100. In order to manufacture the high frequency module 100 at reduced cost, it is considered that the wiring electrodes 105 and 106 at the lower side of the ground electrode 103 are provided at the upper layer side of the ground electrode 103 and are connected to the predetermined signal terminals through via conductors or the like. However, when the wiring electrodes 105 and 106 pass through portions just under the semiconductor element 102, there is a risk that electromagnetic coupling is generated between the semiconductor element 102 and the wiring electrodes 105 and 106 and high frequency characteristics are deteriorated. For this reason, it is difficult to use the above-mentioned configuration.

SUMMARY OF THE INVENTION

Accordingly, preferred embodiments of the present invention provide a technique of manufacturing a high frequency module at reduced cost while preventing electromagnetic coupling between an in-plane conductor that is provided in a multilayer substrate and a component, and reducing a size of the high frequency module.

According to a preferred embodiment of the present invention, a high frequency module includes a multilayer substrate on which a component is mounted on an upper surface. The high frequency module includes a ground mounting electrode that is provided on the upper surface of the multilayer substrate and is connected to a ground terminal of the component, a flat plate-shaped first ground in-plane conductor that is provided in the multilayer substrate on a portion under the component and is connected to the ground mounting electrode with a first ground interlayer connecting conductor, a specific signal mounting electrode that is provided on the upper surface of the multilayer substrate and is connected to a specific signal terminal which is any one of a plurality of signal terminals of the component, and a specific signal in-plane line conductor that is provided in the multilayer substrate on a portion under the first ground in-plane conductor and is connected to the specific signal mounting electrode with a specific signal interlayer connecting conductor. The first ground in-plane conductor is arranged between the component and the specific signal in-plane conductor, and the specific signal interlayer connecting conductor is arranged on an outer side portion of the first ground in-plane conductor when seen from above.

In this case, the first ground in-plane conductor is arranged between the component and the specific signal in-plane conductor passing through a portion under the component. This prevents electromagnetic coupling between the component and the specific signal in-plane conductor. The prevention of the electromagnetic coupling eliminates the necessity of wiring the specific signal in-plane conductor in a bypass manner so as not to pass through a portion just under the component, for example. With this, the wiring length of the specific signal in-plane conductor is small, thus reducing a size of the high frequency module.

Further, the specific signal interlayer connecting conductor that connects the specific signal in-plane line conductor provided on the portion under the first ground in-plane conductor and the specific signal mounting electrode provided on the upper surface of the multilayer substrate is arranged on the outer side portion of the first ground in-plane conductor when seen from above. This eliminates the necessity of providing an opening on the first ground in-plane conductor and forming a through-hole passing through the opening for connecting the specific signal mounting electrode and the specific signal in-plane conductor unlike the existing high frequency module. As a result, the manufacturing cost of the high frequency module is significantly reduced.

In addition, it is preferable that the component have a rectangular or substantially rectangular shape when seen from above, the specific signal terminal be provided on the component at one side, and the specific signal in-plane conductor be wired from the one side of the component to an opposing side which opposes the one side. In this case, for example, when the specific signal terminal (specific signal mounting electrode) of the component and another component or the like arranged at the opposing side of the component are connected, the wiring path thereof is capable of being shortened, thus improving electric characteristics of the wiring path.

Further, it is preferable that the high frequency module further include a flat plate-shaped second ground in-plane conductor which is provided in the multilayer substrate at a lower layer side relative to the specific signal in-plane conductor and is connected to the first ground in-plane conductor with a plurality of second ground interlayer connecting conductors, a plurality of first ground interlayer connecting conductors be provided, the total number of second ground interlayer connecting conductors be set to be smaller than the total number of first ground interlayer connecting conductors, and the specific signal in-plane conductor be arranged on a region on which no second ground interlayer connecting conductor is provided between the first ground in-plane conductor and the second ground in-plane conductor.

In this case, the second ground in-plane conductor is provided at the lower layer side relative to the specific signal in-plane conductor. Therefore, when the lower surface of the multilayer substrate is connected to a mother board or the like, for example, electromagnetic coupling between the mother board and the specific signal in-plane conductor is prevented.

In addition, the total number of second ground interlayer connecting conductors connecting the first ground in-plane conductor and the second ground in-plane conductor is set to be smaller than the total number of first ground interlayer connecting conductors. Further, the specific signal in-plane conductor is arranged on the region on which no second ground interlayer connecting conductor is provided between the first ground in-plane conductor and the second ground in-plane conductor. With this configuration, a formation space of the specific signal in-plane conductor that is arranged on the portion under the first ground in-plane conductor is ensured without increasing the area of the first ground in-plane conductor.

Further, it is preferable that the first ground in-plane conductor have an elongated rectangular shape or a substantially elongated rectangular shape when seen from above, and the specific signal in-plane conductor be wired along a lengthwise direction of the first ground in-plane conductor so as to intersect with both opposing short sides of the first ground in-plane conductor when seen from above. With this configuration, a region of the specific signal in-plane conductor on which electromagnetic coupling to the component is prevented with the first ground in-plane conductor is made larger than that in the case where the specific signal in-plane conductor is wired so as to intersect with long sides of the first ground in-plane conductor. This improves an effect of preventing the electromagnetic coupling.

Moreover, it is preferable that the first ground in-plane conductor be provided within a region overlapping with the component when seen from above. In this case, the first ground in-plane conductor is significantly reduced in size. This improves the degree of freedom in design of the in-plane conductors and the like that are provided in the multilayer substrate.

According to various preferred embodiments of the present invention, the first ground in-plane conductor is arranged between the component and the specific signal in-plane conductor passing through a portion under the component. This prevents electromagnetic coupling between the component and the specific signal in-plane conductor. The prevention of the electromagnetic coupling eliminates the necessity of wiring the specific signal in-plane conductor in a bypass manner so as not to pass through the portion just under the component, for example. With this, the wiring length of the specific signal in-plane conductor is made small, thus reducing the high frequency module in size.

Further, the specific signal interlayer connecting conductor that connects the specific signal in-plane line conductor provided on the portion under the first ground in-plane conductor and the specific signal mounting electrode provided on the upper surface of the multilayer substrate is arranged on the outer side portion of the first ground in-plane conductor when seen from above. This eliminates the necessity of providing an opening on the first ground in-plane conductor and forming a through-hole passing through the opening for connecting the specific signal mounting electrode and the specific signal in-plane conductor unlike the existing high frequency module. As a result, the manufacturing cost of the high frequency module is significantly reduced.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
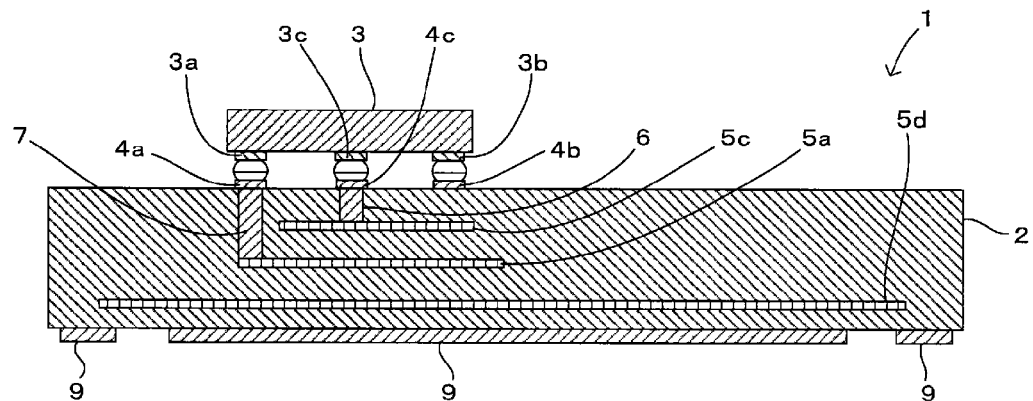
FIG. 1 is a cross-sectional view of a high frequency module according to a preferred embodiment of the present invention.
Figure 2:
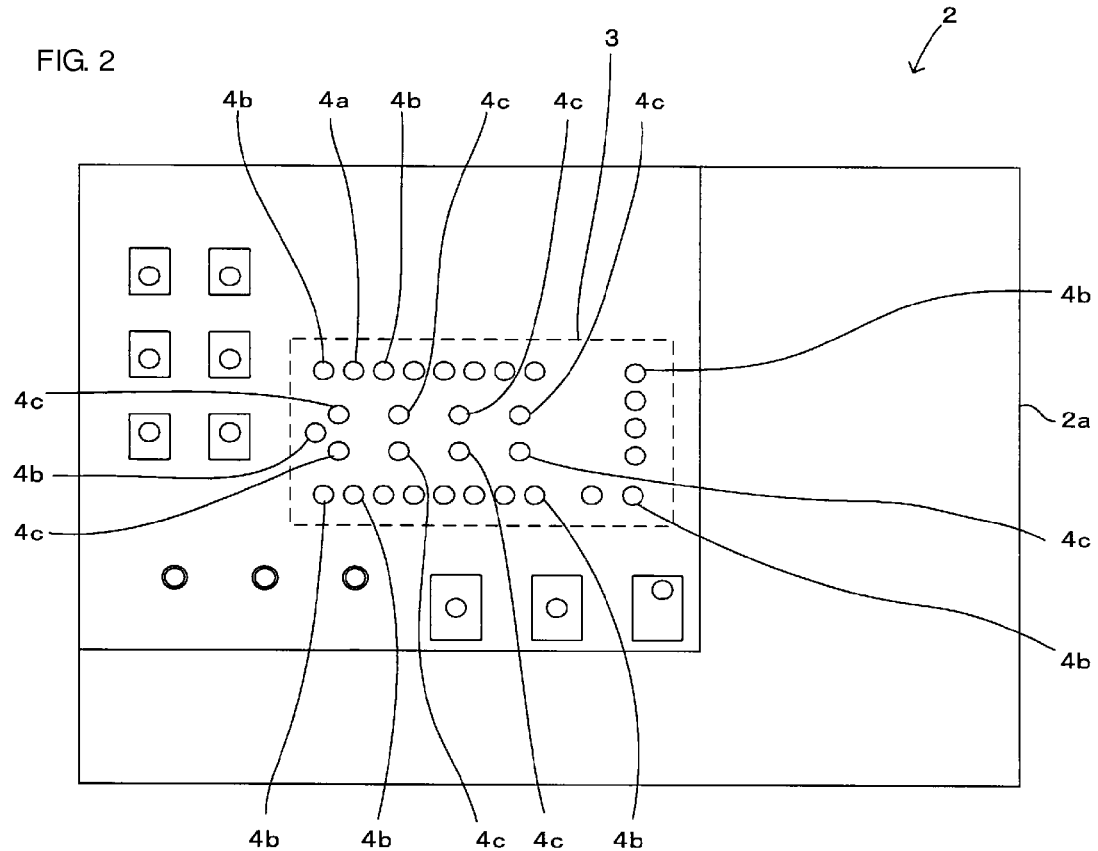
FIG. 2 is a top view of a multilayer substrate of FIG. 1.
Figure 3:
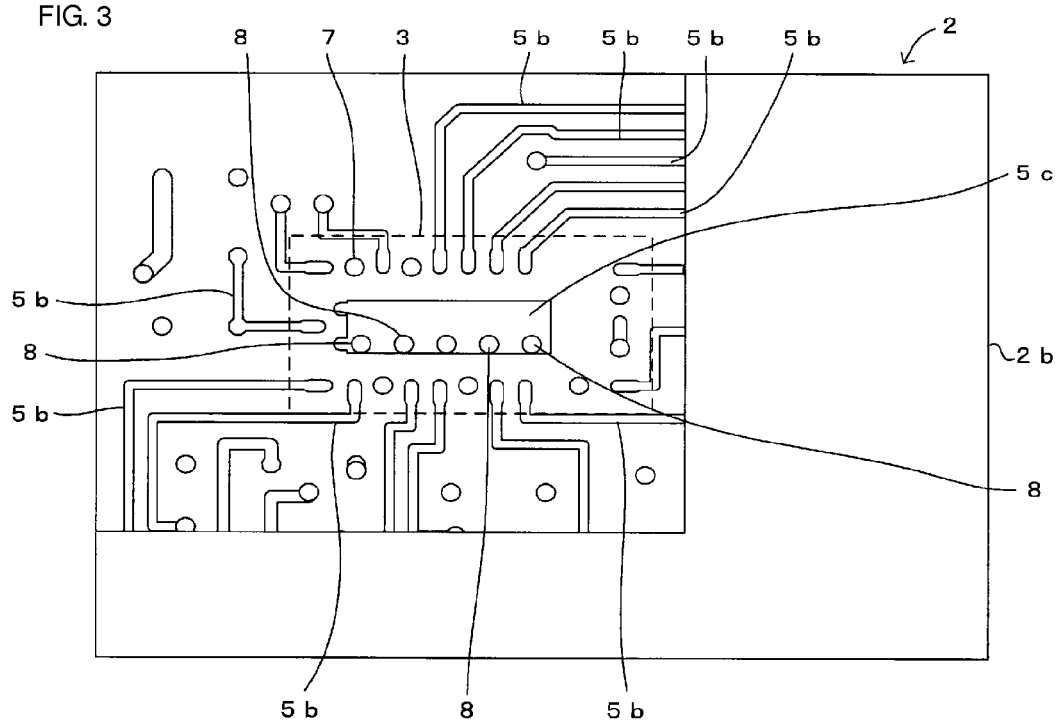
FIG. 3 is a plan view of an insulating layer on which a first ground in-plane conductor of FIG. 1 is provided.
Figure 4:
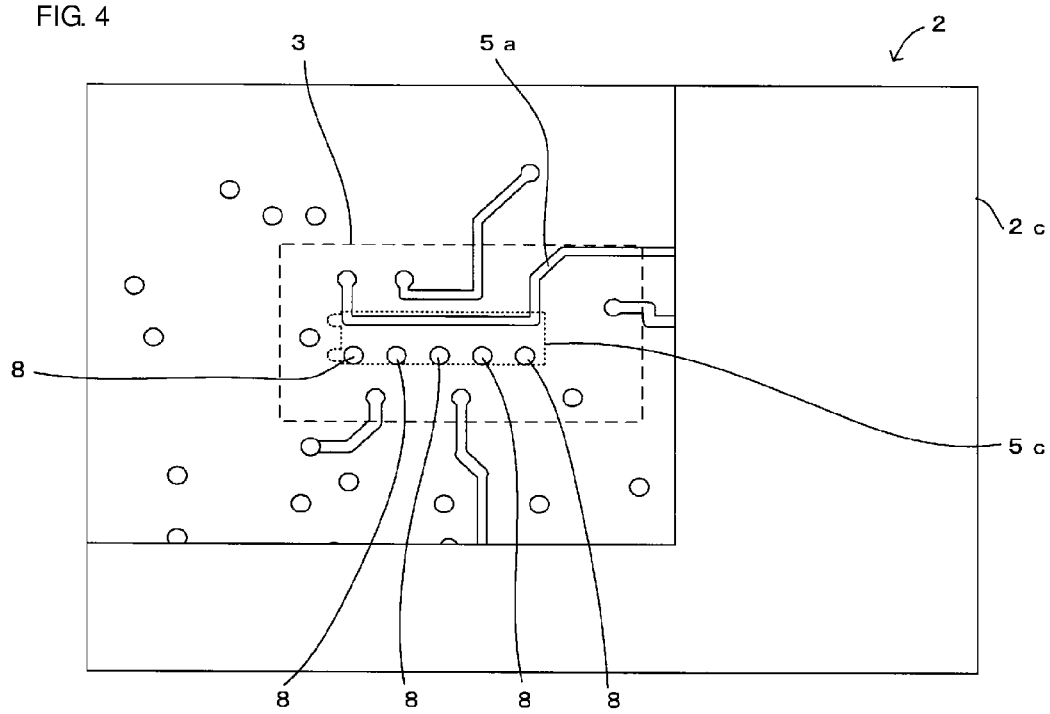
FIG. 4 is a plan view of an insulating layer on which a specific signal in-plane conductor of FIG. 1 is provided.
Figure 5:
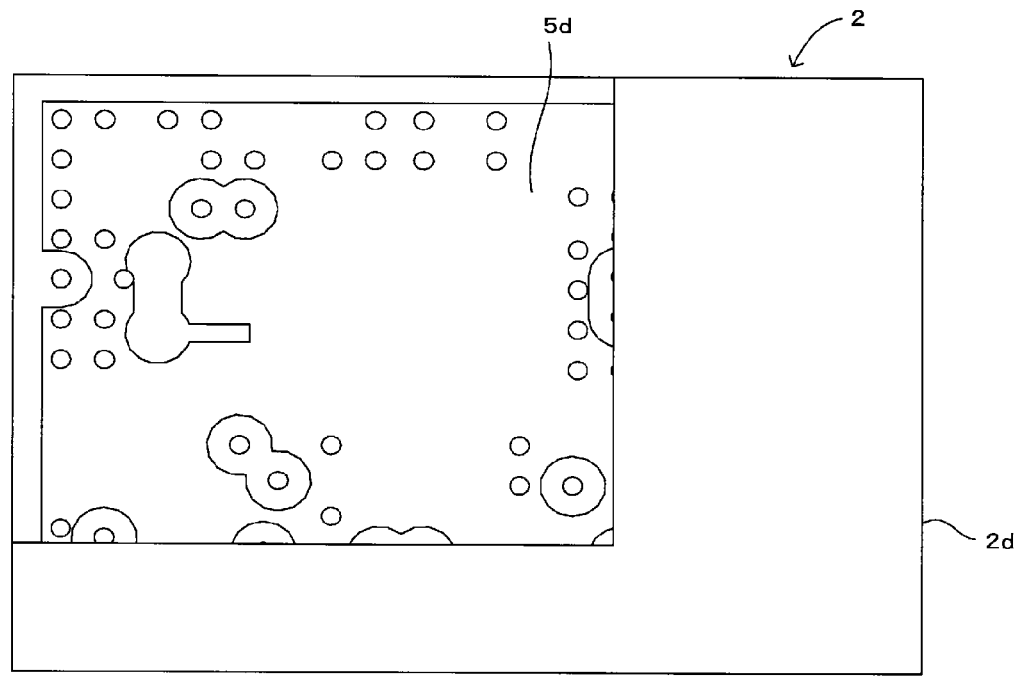
FIG. 5 is a plan view of an insulating layer on which a second ground in-plane conductor of FIG. 1 is provided.

A high frequency module 1 according to preferred embodiments of the present invention will be described with reference to FIG. 1 to FIG. 5. FIG. 1 is a cross-sectional view of the high frequency module 1 according to a present preferred embodiment of the present invention. FIG. 2 is a top view of a multilayer substrate 2 of FIG. 1. FIG. 3 is a plan view of an insulating layer 2b on which a first ground in-plane conductor of FIG. 1 is provided. FIG. 4 is a plan view of an insulating layer 2c on which a specific signal in-plane conductor 5a of FIG. 1 is provided. FIG. 5 is a plan view of an insulating layer 2d on which a second ground in-plane conductor 5d of FIG. 1 is provided. Main parts relating to the present invention are illustrated and illustration of other parts is omitted in each of FIG. 2 to FIG. 5.

As illustrated in FIG. 1, the high frequency module 1 in the present preferred embodiment includes a multilayer substrate 2 and a component 3. The component 3 is mounted on the upper surface of the multilayer substrate 2. For example, the high frequency module 1 is mounted on a mother board of a communication device such as a cellular phone. Other components (for example, chip capacitor and chip inductor, not illustrated) are preferably mounted on the upper surface of the multilayer substrate 2 in addition to the component 3.

The component 3 preferably is a radio frequency integrated circuit (RF-IC), a switch IC, a chip surface acoustic wave (SAW) filter, or the like and is flip-chip mounted on the upper surface of the multilayer substrate 2 in the present preferred embodiment. In this case, the component 3 preferably has an elongated rectangular shape or a substantially elongated rectangular shape when seen from above and a plurality of signal terminals 3a and 3b and a plurality of ground terminals 3c are provided on an opposing surface of the component 3, which opposes the upper surface of the multilayer substrate 2. The respective ground terminals 3c are collectively arranged at or substantially at the center on the opposing surface of the component 3 and the signal terminals 3a and 3b are arranged to be aligned on a peripheral edge portion of the opposing surface of the component 3. It should be noted that the shape of the component 3 when seen from above is not limited to the elongated rectangular shape or a substantially elongated rectangular shape and may be substantially square shape, for example.

The multilayer substrate 2 is formed preferably by laminating a plurality of insulating layers 2a to 2d and each of these insulating layers 2a to 2d is made of an insulating material such as ceramics and glass epoxy resin or the like. A plurality of mounting electrodes 4a to 4c for mounting the component 3 are formed on the upper surface of the multilayer substrate 2 and a plurality of outer electrodes 9 for connection to an external mother board or the like are formed on the lower surface of the multilayer substrate 2.

As illustrated in FIG. 2, the plurality of mounting electrodes 4a to 4c to mount the component 3 are provided on the upper surface of the insulating layer 2a of an uppermost layer of the multilayer substrate 2 at positions corresponding to the respective signal terminals 3a and 3b and the respective ground terminals 3c of the component 3.

As illustrated in FIG. 3, in-plane line conductors 5b as lead-out wirings from some mounting electrodes 4b among the respective mounting electrodes 4a and 4b are provided on the main surface of the predetermined insulating layer 2b arranged on a lower layer relative to the insulating layer 2a. In this case, the mounting electrodes 4b and the in-plane conductors 5b are connected with via conductors (not illustrated).

As illustrated in FIG. 3, a flat plate-shaped first ground in-plane conductor 5c having an elongated rectangular shape or a substantially elongated rectangular shape when seen from above is provided on a portion under the component 3. To be specific, the first ground in-plane conductor 5c is provided in a range of a region on the main surface of the insulating layer 2b, which overlaps with the component 3 when seen from above. Further, the first ground in-plane conductor 5c is provided on a region overlapping with the respective mounting electrodes 4c (corresponding to "ground mounting electrode" in preferred embodiments of the present invention, and is referred to as ground mounting electrodes 4c hereinafter) connected to the respective ground terminals 3c of the component 3 when seen from above. The respective ground mounting electrodes 4c are connected to the first ground in-plane conductor 5c with via conductors 6 (see FIG. 1) provided individually for these ground mounting electrodes 4c. The via conductors 6 correspond to a "first ground interlayer connecting conductor" in preferred embodiments of the present invention, and the respective via conductors 6 are referred to as first ground interlayer connecting conductors 6 hereinafter.

The first ground in-plane conductor 5c is arranged at or substantially at the center of the region on the main surface of the insulating layer 2b, which overlaps with the component 3 when seen from above. The in-plane conductors 5b as the lead-out wirings from the mounting electrodes 4b are wired to outer side portions of the component 3 from the periphery of the first ground in-plane conductor 5c when seen from above.

That is to say, the degree of freedom in wiring of the respective in-plane conductors 5b on the main surface of the insulating layer 2b is improved by arranging the first ground in-plane conductor 5c only at or substantially at the center of the region on the insulating layer 2b, which overlaps with the component 3 when seen from above.

As illustrated in FIG. 1, the mounting electrode 4a connected to the predetermined signal terminal 3a arranged at the one short side (left end of a paper plane in FIG. 1) of the component 3 having the elongated rectangular shape or a substantially elongated rectangular shape when seen from above among the signal terminals 3a and 3b of the component 3 is connected to the in-plane line conductor 5a (see FIG. 4) with a via conductor 7. The in-plane line conductor 5a is provided on the main surface of the insulating layer 2c located on a further lower layer relative to the insulating layer 2b. The via conductor 7 is arranged on an outer side portion of the first ground in-plane conductor 5c when seen from above. The predetermined signal terminal 3a corresponds to a "specific signal terminal" in preferred embodiments of the present invention, the mounting electrode 4a corresponds to a "specific signal mounting electrode" in preferred embodiments of the present invention, the via conductor 7 corresponds to a "specific signal interlayer connecting conductor" in preferred embodiments of the present invention, and the in-plane conductor 5a corresponds to a "specific signal in-plane conductor" in preferred embodiments of the present invention. Hereinafter, the predetermined signal terminal 3a is referred to as a specific signal terminal 3a, the mounting electrode 4a is referred to as a specific signal mounting electrode 4a, the via conductor 7 is referred to as a specific signal interlayer connecting conductor 7, and the in-plane conductor 5a is referred to as a specific signal in-plane conductor 5a.

The first ground in-plane conductor 5c is not necessarily located within the range of the region on the main surface of the insulating layer 2b, which overlaps with the component 3 when seen from above. The shape and formation region of the first ground in-plane conductor 5c can be appropriately changed in a range not interfering with formation of the specific signal interlayer connecting conductor 7.

As illustrated in FIG. 1, the specific signal in-plane conductor 5a is provided on a portion under the first ground in-plane conductor 5c such that the first ground in-plane conductor 5c is arranged between the specific signal in-plane conductor 5a and the component 3. As illustrated in FIG. 4, the specific signal in-plane conductor 5a is wired from the one short side (left side of the paper plane) of the component 3 having the elongated rectangular shape or a substantially elongated rectangular shape when seen from above to the other short side opposing the one short side. A portion of the specific signal in-plane conductor 5a, which overlaps with the first ground in-plane conductor 5c when seen from above, is wired so as to be along the long sides of the first ground in-plane conductor 5c. The specific signal in-plane conductor 5a is configured such that the first ground in-plane conductor 5c is interposed between the specific signal in-plane conductor 5a and the component 3 on the greater portion of a region of the specific signal in-plane conductor 5a, which overlaps with the component 3 when seen from above.

The flat plate-shaped second ground in-plane conductor 5d having the area larger than that of the first ground in-plane conductor 5c is provided on the main surface of the insulating layer 2d located on a lower layer relative to the insulating layer 2c, as illustrated in FIG. 5. The second ground in-plane conductor 5d is connected to the first ground in-plane conductor 5c with a plurality of via conductors 8 (see FIG. 3 and FIG. 4). Each of the via conductors 8 corresponds to a "second ground interlayer connecting conductor" in preferred embodiments of the present invention and each of the via conductors 8 is referred to as a second ground interlayer connecting conductor 8, hereinafter.

In the present preferred embodiment, the total number of ground mounting electrodes 4c provided on the upper surface of the multilayer substrate 2 preferably is 8 (see FIG. 2), for example. The total number of first ground interlayer connecting conductors 6 connecting the respective ground mounting electrodes 4c and the first ground in-plane conductor 5c preferably is also 8, for example. On the other hand, the total number of second ground interlayer connecting conductors 8 connecting the first ground in-plane conductor 5c and the second ground in-plane conductor 5d preferably is 5, for example, as illustrated in FIG. 3 and FIG. 4. That is to say, the total number of second ground interlayer connecting conductors 8 is set to be smaller than the total number of first ground interlayer connecting conductors 6.

The specific signal in-plane conductor 5a is arranged on a region on which no second ground interlayer connecting conductor 8 is provided between the first ground in-plane conductor 5c and the second ground in-plane conductor 5d. That is to say, the number of second ground interlayer connecting conductor 8 just under the first ground in-plane conductor 5c is decreased so as to ensure an empty space at the lower side of the first ground in-plane conductor 5c and enhance the degree of freedom in formation of the specific signal in-plane conductor 5a. For example, a configuration in which the specific signal in-plane conductor 5a is arranged so as to pass through between the adjacent second ground interlayer connecting conductors 8 without setting the total number of second ground interlayer connecting conductors 8 to be smaller than that of first ground interlayer connecting conductors 6 may be used.

Accordingly, with the above-mentioned preferred embodiment, the first ground in-plane conductor 5c is arranged between the component 3 mounted on the upper surface of the multilayer substrate 2 and the specific signal in-plane conductor 5a passing through a portion under the component 3. This prevents electromagnetic coupling between the component 3 and the specific signal in-plane conductor 5a. The prevention of the electromagnetic coupling eliminates the necessity of wiring the specific signal in-plane conductor 5a in a bypass manner so as not to pass through the portion under the component 3. With this, the wiring length of the specific signal in-plane conductor 5a is made small, thus reducing the high frequency module 1 in size.

In addition, the specific signal interlayer connecting conductor 7 that connects the specific signal in-plane conductor 5a provided on the portion under the first ground in-plane conductor 5c and the specific signal mounting electrode 4a provided on the upper surface of the multilayer substrate 2 is arranged on the outer side portion of the first ground in-plane conductor 5c when seen from above. This eliminates the necessity of providing an opening on the first ground in-plane conductor 5c and forming a through-hole passing through the opening for connecting the specific signal mounting electrode 4a and the specific signal in-plane conductor 5a unlike the existing high frequency module. As a result, the manufacturing cost of the high frequency module 1 is significantly reduced.

In addition, the specific signal in-plane conductor 5a is wired from the one short side of the component 3 having the elongated rectangular shape or a substantially elongated rectangular shape when seen from above to the other short side opposing the one side. Therefore, for example, when the specific signal terminal 3a of the component 3 and another component or the like arranged at the other short side of the component 3 are connected, the wiring path thereof is capable of being shortened, thus improving electric characteristics of the wiring path.

Further, the second ground in-plane conductor 5d having the area larger than the area of the first ground in-plane conductor 5c is provided on the lower layer relative to the specific signal in-plane conductor 5a. Therefore, when the high frequency module 1 is mounted on an external mother board or the like, electromagnetic coupling between the mother board and the specific signal in-plane conductor 5a or the component 3 is prevented.

In addition, the total number of second ground interlayer connecting conductors 8 connecting the first ground in-plane conductor 5c and the second ground in-plane conductor 5d is set to be smaller than the total number of first ground interlayer connecting conductors 6 connecting the respective ground mounting electrodes 4c and the first ground in-plane conductor 5c. Further, the specific signal in-plane conductor 5a is arranged on the region on which no second ground interlayer connecting conductor 8 is provided between the first ground in-plane conductor 5c and the second ground in-plane conductor 5d. With this configuration, a formation space of the specific signal in-plane conductor 5a that is arranged on the portion under the first ground in-plane conductor 5c is ensured without increasing the area of the first ground in-plane conductor 5c.

The first ground in-plane conductor 5c that prevents the electromagnetic coupling between the component 3 and the specific signal in-plane conductor 5a is configured to be small within the region overlapping with the component 3 when seen from above. This improves the degree of freedom in design of the in-plane conductors and the like that are provided in the multilayer substrate 2.

Figure 6:
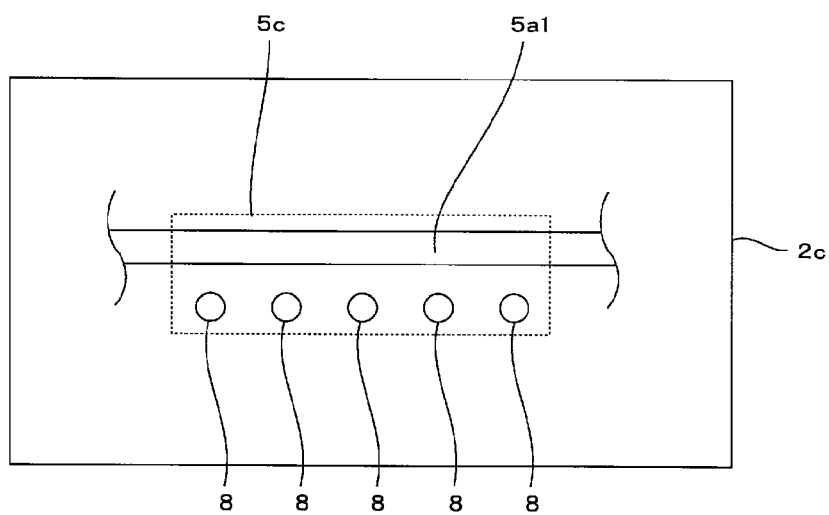
FIG. 6 is a view illustrating a variation on the specific signal in-plane conductor.
Figure 7:
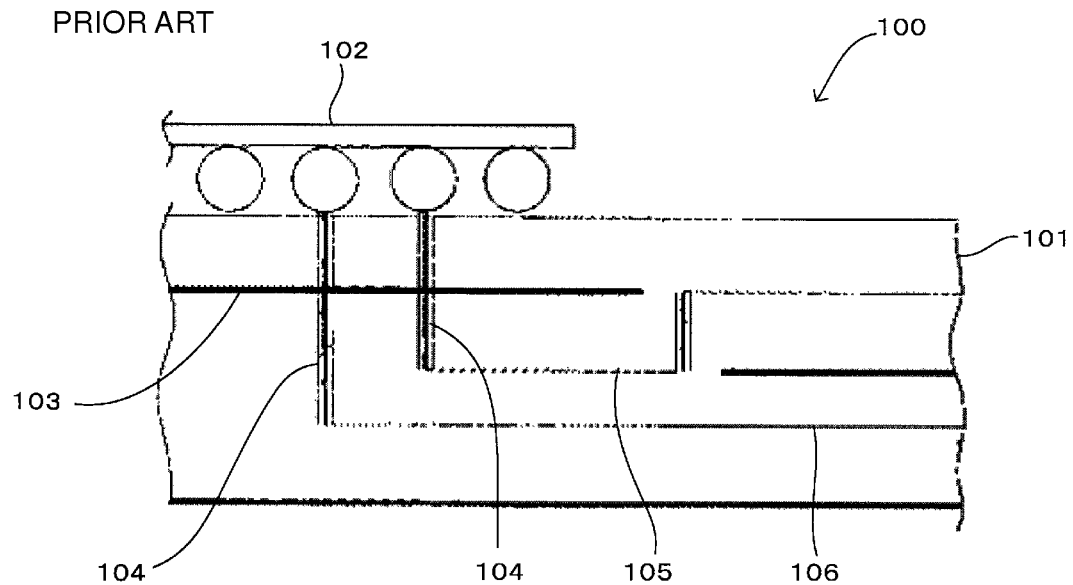
FIG. 7 is a cross-sectional view of an existing high frequency module.

A variation on the specific signal in-plane conductor 5a provided on the portion under the first ground in-plane conductor 5c will be described with reference to FIG. 6. FIG. 6 is a view illustrating a specific signal in-plane conductor 5a1 in the variation and is a partial plan view of the insulating layer 2c.

As illustrated in FIG. 6, the specific signal in-plane conductor 5a1 is wired along the lengthwise direction of the first ground in-plane conductor 5c so as to intersect with both the opposing short sides of the first ground in-plane conductor 5c. With this configuration, a region of the specific signal in-plane conductor 5a1 on which electromagnetic coupling between the component 3 and the first ground in-plane conductor 5c is capable of being prevented is made larger than that in the case where the specific signal in-plane conductor 5a1 is wired so as to intersect with long sides of the first ground in-plane conductor 5c. This improves an effect of preventing the electromagnetic coupling.

The present invention is not limited to the above-mentioned respective preferred embodiments and can be variously changed in addition to those as described above in a range without departing from the scope thereof. For example, although the specific signal interlayer connecting conductor 7, the respective first ground interlayer connecting conductors 6, and the respective second ground interlayer connecting conductors 8 preferably are provided with the via conductors in each of the above-mentioned preferred embodiments, they may be formed with post electrodes or pin-shaped conductors, for example.

The in-plane conductor provided on the portion under the first ground in-plane conductor 5c is not limited to the above-mentioned specific signal in-plane conductor 5a and may be another in-plane conductor which is needed to prevent electromagnetic coupling from generating with the component 3.

Although the first ground in-plane conductor 5c is preferably provided on the internal insulating layer 2b in each of the above-mentioned preferred embodiments, it may be arranged on the upper surface of the multilayer substrate 2. In this case, the first ground in-plane conductor 5c is preferably used instead of the ground mounting electrodes 4c. To be specific, it is sufficient that an insulating coat film (what-is-called framing) is applied onto the first ground in-plane conductor 5c and openings are provided on portions (mounting surface) of the insulating coat film, which correspond to the respective ground mounting electrodes 4c.

Further, preferred embodiments of the present invention can be applied to various high frequency modules on which components are mounted on the upper surface of a multilayer substrate.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
a multilayer substrate on which a component is mounted on an upper surface thereof;
a ground mounting electrode located on the upper surface of the multilayer substrate and connected to a ground terminal of the component;
a flat plate-shaped first ground in-plane conductor located on or in the multilayer substrate on a portion under the component and connected to the ground mounting electrode with a first ground interlayer connecting conductor;
a specific signal mounting electrode located on the upper surface of the multilayer substrate and connected to a specific signal terminal which is any one of a plurality of signal terminals of the component; and
a specific signal in-plane line conductor located in the multilayer substrate on a portion under the first ground in-plane conductor and connected to the specific signal mounting electrode with a specific signal interlayer connecting conductor; wherein
the first ground in-plane conductor is located between the component and the specific signal in-plane conductor; and
the specific signal interlayer connecting conductor is located on an outer side portion of the first ground in-plane conductor when seen from above.

2. The high frequency module according to claim 1, wherein
the component has a rectangular or substantially rectangular shape when seen from above;
the specific signal terminal is provided on the component at one side; and
the specific signal in-plane conductor is wired from the one side of the component to an opposing side which opposes the one side.

3. The high frequency module according to claim 1, further comprising:

a flat plate-shaped second ground in-plane conductor that is provided in the multilayer substrate at a lower layer side relative to the specific signal in-plane conductor and is connected to the first ground in-plane conductor with a plurality of second ground interlayer connecting conductors;
a plurality of first ground interlayer connecting conductors; wherein
a total number of the plurality of second ground interlayer connecting conductors is smaller than a total number of the plurality of first ground interlayer connecting conductors; and
the specific signal in-plane conductor is located in a region in which no second ground interlayer connecting conductor is provided between the first ground in-plane conductor and the second ground in-plane conductor.

4. The high frequency module according to claim 1, wherein
the first ground in-plane conductor has an elongated rectangular shape or a substantially elongated rectangular shape when seen from above; and
the specific signal in-plane conductor is wired along a lengthwise direction of the first ground in-plane conductor so as to intersect with both opposing short sides of the first ground in-plane conductor when seen from above.

5. The high frequency module according to claim 1, wherein the first ground in-plane conductor is located within a region overlapping with the component when seen from above.

6. The high frequency module according to claim 1, wherein the component is one of a radio frequency integrated circuit, a switch IC, and a chip surface acoustic wave filter.

7. The high frequency module according to claim 1, further comprising one of a plurality of via conductors, a plurality of post electrodes, and a plurality of pin-shaped conductors provided in or on the multilayer substrate.

8. The high frequency module according to claim 3, wherein the plurality of first ground interlayer connecting conductors include via conductors.

9. The high frequency module according to claim 1, wherein the first ground in-plane conductor is located is located at or substantially at a center of a region on an insulator layer of the multilayer substrate that overlaps the component when seen from above.

10. The high frequency module according to claim 3, wherein the second ground in-plane conductor has an area larger than that of the first ground in-plane conductor.

11. The high frequency module according to claim 1, wherein the specific signal in-plane conductor is wired from one short side of the component when seen from above to another other short side opposing the one short side of the component.

12. The high frequency module according to claim 1, wherein the specific signal in-plane conductor is wired along a lengthwise direction of the first ground in-plane conductor so as to intersect with opposing short sides of the first ground in-plane conductor.

13. A communication device comprising the high frequency module according to claim 1.

14. The communication device according to claim 13, wherein the communication device is a cellular phone.

* * * * *